(12) United States Patent
Higgins

(10) Patent No.: US 7,287,659 B2
(45) Date of Patent: Oct. 30, 2007

(54) WATER ENDPOINT ENCLOSURE

(75) Inventor: Sidney A. Higgins, Maple Grove, MN (US)

(73) Assignee: Itron, Inc., Liberty Lake, WA (US)

(*) Notice: Subject to any disclaimer, the term of this patent is extended or adjusted under 35 U.S.C. 154(b) by 274 days.

(21) Appl. No.: 10/929,749

(22) Filed: Aug. 30, 2004

(65) Prior Publication Data

US 2005/0051457 A1   Mar. 10, 2005

Related U.S. Application Data

(60) Provisional application No. 60/500,533, filed on Sep. 5, 2003.

(51) Int. Cl.
*B65D 3/08* (2006.01)
*B65D 1/24* (2006.01)
*B65D 1/36* (2006.01)

(52) U.S. Cl. ............... 220/4.02; 220/535; 220/521
(58) Field of Classification Search ............... 220/4.02; 439/535; 174/521
See application file for complete search history.

(56) References Cited

U.S. PATENT DOCUMENTS

| 2,094,356 | A | * | 9/1937 | Hagist ..................... 361/669 |
|---|---|---|---|---|
| 4,121,147 | A | * | 10/1978 | Becker et al. ............... 324/104 |
| 5,088,004 | A | * | 2/1992 | Howell ..................... 361/669 |
| 5,148,347 | A |   | 9/1992 | Cox et al. |
| 5,151,239 | A |   | 9/1992 | King, Jr. |
| 5,239,129 | A |   | 8/1993 | Ehrenfels |
| 5,796,041 | A |   | 8/1998 | Suzuki et al. |
| 5,825,303 | A |   | 10/1998 | Bloss, Jr. et al. |
| 6,433,275 | B1 |   | 8/2002 | Rittmann et al. |

* cited by examiner

*Primary Examiner*—Anthony D. Stashick
*Assistant Examiner*—Shawn Braden
(74) *Attorney, Agent, or Firm*—Patterson, Thuente, Skaar & Christensen, P.A.

(57) ABSTRACT

A waterproof enclosure primarily for radio frequency transmitters used in an automatic meter reading (fixed or mobile) system is described. In one example embodiment, the enclosure includes a base unit, cover that is press-fit into the base unit and a collar that has interlocking ends that compressively secure the base and cover together. The enclosure assembly further includes a seal member or O-ring that is interposed between bearing surfaces of the lid and base to promote a waterproof seal.

3 Claims, 7 Drawing Sheets

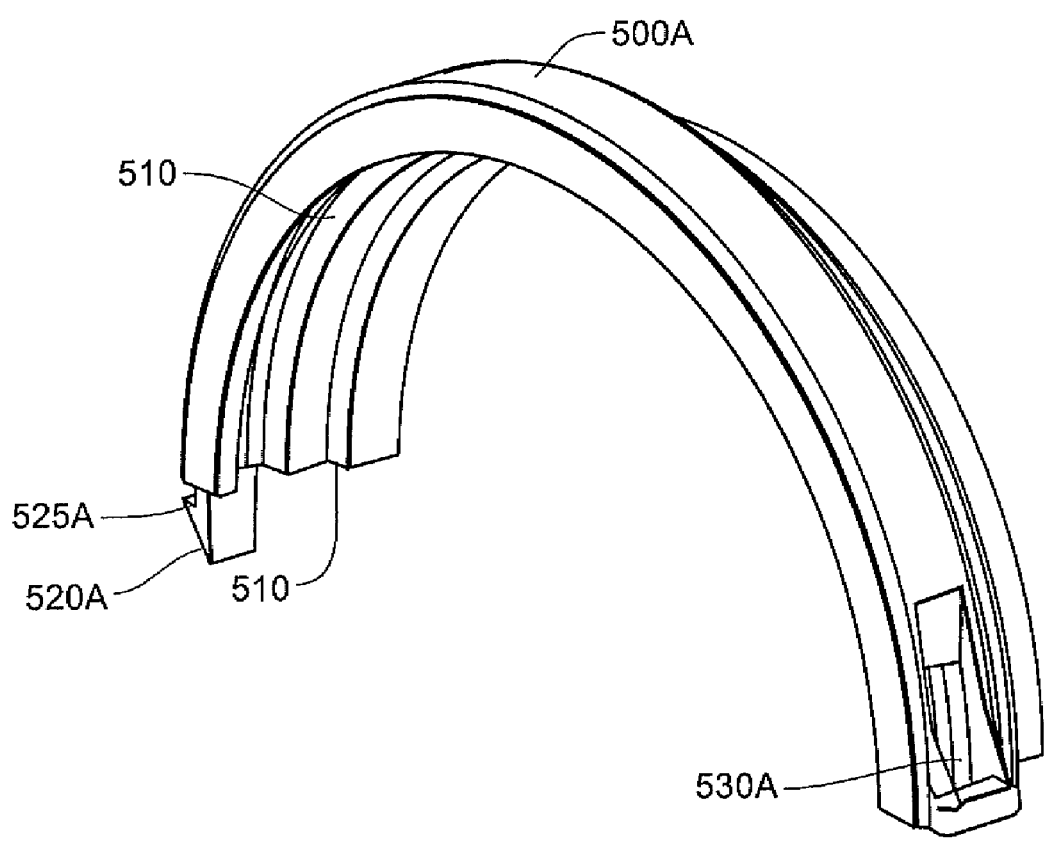

WATER ENDPOINT ENCLOSURE

RELATED APPLICATION

This application claims the benefit of U.S. Provisional Application No. 60/500,533, filed Sep. 5, 2003.

FIELD OF THE INVENTION

The invention relates generally to contaminant-proof enclosures and more particularly, relates to a waterproof enclosure for electrical and electronic components.

BACKGROUND OF THE INVENTION

In many applications, electrical circuitry and other delicate instrumentation together with the end connections between electrical wires or cables are required to operate under ambient conditions where they can be exposed to contaminants such as moisture, chemicals, fire, gases and the like. These contaminants can degrade the components to an extent that they can malfunction. In particular, electrical end connections require shielding from moisture and other ambient conditions to prevent shorts, sparking and disconnections. Typically, components such as electrical circuitry and other electrical elements include the electrical endpoint connections in sealed enclosures, which are designed to prevent the permeation of water and other contaminants into the enclosure. However, the better the seal the more expensive the enclosure.

The prior art contains several approaches for constructing and using such enclosures. U.S. Pat. No. 5,825,303 discloses a sealed housing and method of sealing for apparatus in meter pit enclosures. The '303 invention appears to teach a sealed housing for a transponder unit in a utility meter pit enclosure. The sealed housing has an appropriately sized tube in which transponder electronics carried by a circuit board and an antenna are inserted from the bottom and fitted into guide structures and then a body of epoxy adhesive/ sealant is used to fill the cavity of the tube and encapsulate the electronics and antenna within the tube. The epoxy sealant seals and forms a recessed lower end of the tube, which, in use, appears to be immersible in water within a subsurface pit enclosure. A method of assembling and sealing the unit is also disclosed.

U.S. Pat. No. 5,796,041 appears to disclose a waterproof protective cover comprising an upper casing member and a lower casing member that are obtained by cutting a box-like casing molded out of insulating resin materials into two halves in a longitudinal direction of the casing. A sidewall on the left sides of the casing member and a sidewall on the right side of the casing member are pivotably connected by means of hinges in the longitudinal direction of the casing. Thus, these upper and lower casing members can be put together and opened.

U.S. Pat. No. 5,151,239 appears to teaches an enclosure having a conductive, threaded wire engaging inner surface disposed within a housing and filled with a sealing compound. A flexure cover closes off the enclosure. U.S. Pat. Nos. 6,433,275 and 5,239,129 also appears to teach alternate constructions of a waterproof enclosure.

The various prior art enclosures appear to teach a sealing compound filling the enclosure and encapsulating the parts to be protected. Moreover, some of the two-part enclosures utilize a hinged connection between the two parts of the enclosure. A hinged connection generally does not provide a uniform pressure between the two mating parts of the enclosure so as to create a waterproof enclosure without auxiliary sealing means.

Accordingly, there is a need for an endpoint transmitter enclosure or receptacle that is reliable and can be manufactured at a low cost. An enclosure that addresses the aforementioned problems, as well as other related problems, is therefore desirable.

SUMMARY OF THE INVENTION

Various embodiments of the invention are directed to addressing various needs in connection with providing waterproof enclosures for radio frequency transmitters used in an automatic meter reading (fixed or mobile) system.

In one example embodiment of the invention, an economical and reliable water endpoint enclosure is described for housing electrical circuit elements and associated wiring/ cable connections. In operation, such an enclosure may be located in a harsh environment where it is susceptible to moisture and other contaminants permeating into the space where the electrical interconnections are housed. The enclosure of the invention provides a relatively large sealed cavity for housing the components that are sought to be protected from the ambient environment. It is amenable to tool-less disassembly whereby unobstructed access can be gained to the components housed within it. The enclosure can be easily resealed and the quality of the seal maintained by using the snap-fitting lock collars to clamp the two portions of the enclosure housing together. The invention also provides an enclosure where a separate conduit operates as the point of entry/exit of wiring or cable into the sealed cavity where the electrical elements and associated endpoint connections are housed. This entry/exit point is moisture-isolated from the ambient environment by means of a sealant thus substantially eliminating the possibility of water ingress through the cable.

BRIEF DESCRIPTION OF THE DRAWINGS

The invention may be more completely understood in consideration of the following detailed description of various embodiments of the invention in connection with the accompanying drawings, in which:

FIGS. 5A and 5B illustrate a pair of molded collars or rings.

Figure 1:
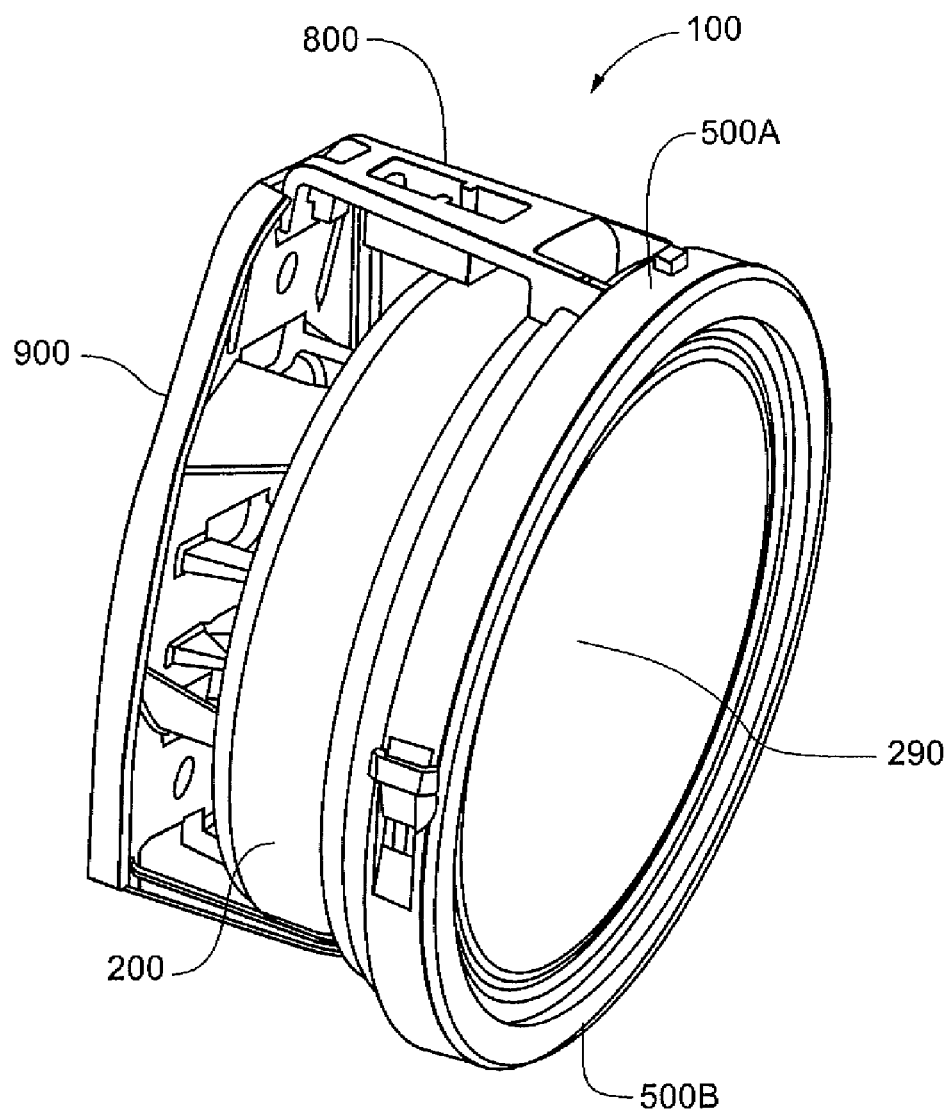
FIG. 1 illustrates an assembly of an exemplary embodiment of a water endpoint enclosure of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

The invention is generally directed to a waterproof enclosure for a radio frequency transmitter used for transmitting data, collected from meter modules, to at least a first tiered receiver or transceiver, wherein the transceiver is assigned by a central utility to a designated area. While the invention is not necessarily limited to such an application, the invention will be better appreciated using a discussion of example embodiments in such a specific context.

While the invention is described in reference to a water endpoint enclosure 100, illustrated in FIG. 1, it is contemplated that the benefits of the invention accrue to alternative types and configurations of water endpoint enclosures. Therefore, in the description that follows, reference to a specific water endpoint enclosure is for exemplary purposes only, and is not intended to restrict or limit the practice of the invention to any particular water endpoint enclosure, such as water endpoint enclosure 100.

Figure 2:
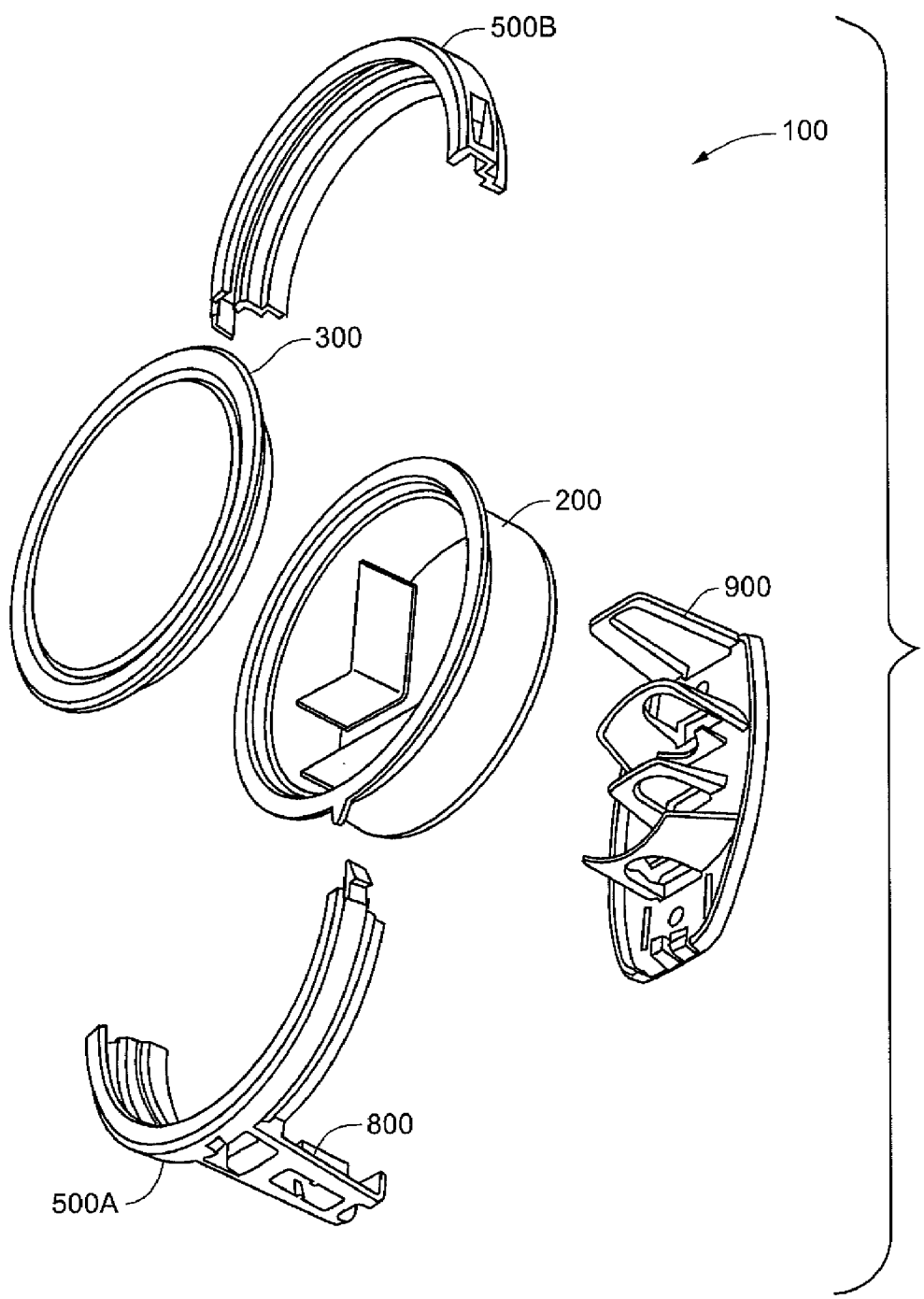
FIG. 2 is an exploded perspective view of a water endpoint enclosure of the invention.

Discussion of the invention will now be made with specific reference to the drawing figures. FIG. 1 illustrates an assembly of an exemplaiy embodiment of a water endpoint enclosure assembly 100 of the invention and FIG. 2 is an exploded perspective view of the assembly depicted in FIG. 1. As shown in FIGS. 1 and 2, water endpoint enclosure assembly 100 has a modular construction and includes a base unit 200 and a lid or cover 300 which can be press-fit into base unit 200 to define a sealed enclosure 290. A flexible ring or plurality of interconnected lock collars 500A, 500B are disposed along the periphery of the base unit 200 and lid 300 to clamp them together and improve the seal between them. At least one collar 500A, 500B can be provided with a mounting tub 800 adapted for releasable attachment to a universal mounting bracket 900.

Figure 3:
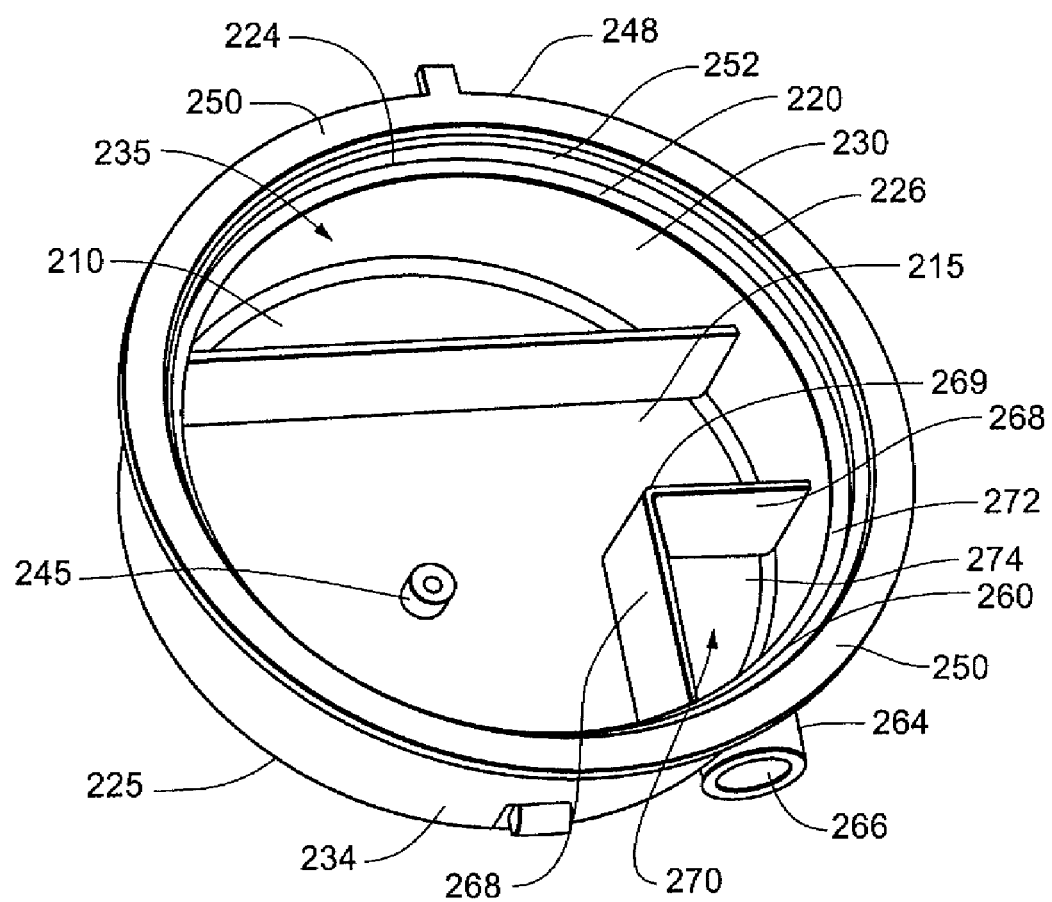
FIG. 3 is an illustration of an embodiment of a base unit of the enclosure according to the invention.

In one embodiment of the water endpoint enclosure, exemplified in FIG. 3, base unit 200 is a generally cylindrical molded structure with a closed end 210 having a first or interior surface 215 and an open or distal end 220. An annular or base unit sidewall 225 having an inner surface 230 and an exterior surface 234 depends outward and away from surface 215 to extend between closed end 210 and open end 220 so as to include a relatively large cavity 235 of internal diameter 237 (not shown) which can protectively encase electrical devices and connecting electrical cabling 240 (not shown) therein. The term "annular" herein is not limited to a circular ring, but rather pertains any cylindrical geometry whereby the surface can be described as generated by a straight line intersecting and moving along a closed plane curve, while remaining parallel to a second fixed straight line that is not on or parallel to the plane of the closed plane curve. First surface 215 may have fins, bosses and other structural elements 245 abutting from surface 215 and into cavity 235 to constitute anchoring means for electrical devices and connecting electrical cabling 240 housed within cavity 235. Annular wall 225 is provided with at least one aperture 260. In the embodiment illustrated in FIG. 3, aperture 260 is in fluid communication with a tubular conduit 264 which is integrally molded with the base unit and disposed along outer surface 234 of annular wall 225 so that an end 266 of conduit 264 communicates with the external ambient environment. A plurality of wall structures 268 with coterminous edges 269 forms a contiguous barrier that extends outwardly from first surface 215 of closed end 210 and cooperates with a portion of side wall 272 containing aperture 260 to form an internal potting well 270 enclosing a cavity 274 in fluid communication with tubular conduit 264 through aperture 260. In a region proximate open end 220 of annular wall 225, cavity 235 increases in diameter to form a radial inset 224 bounded by an outer perimeter 226 and an upward facing lateral or bearing surface 252. At open end 220, the annular wall extends radially outward to form a circumferential base unit flange 248 having a surface 250 and an outer radial perimeter 251.

Figure 4:
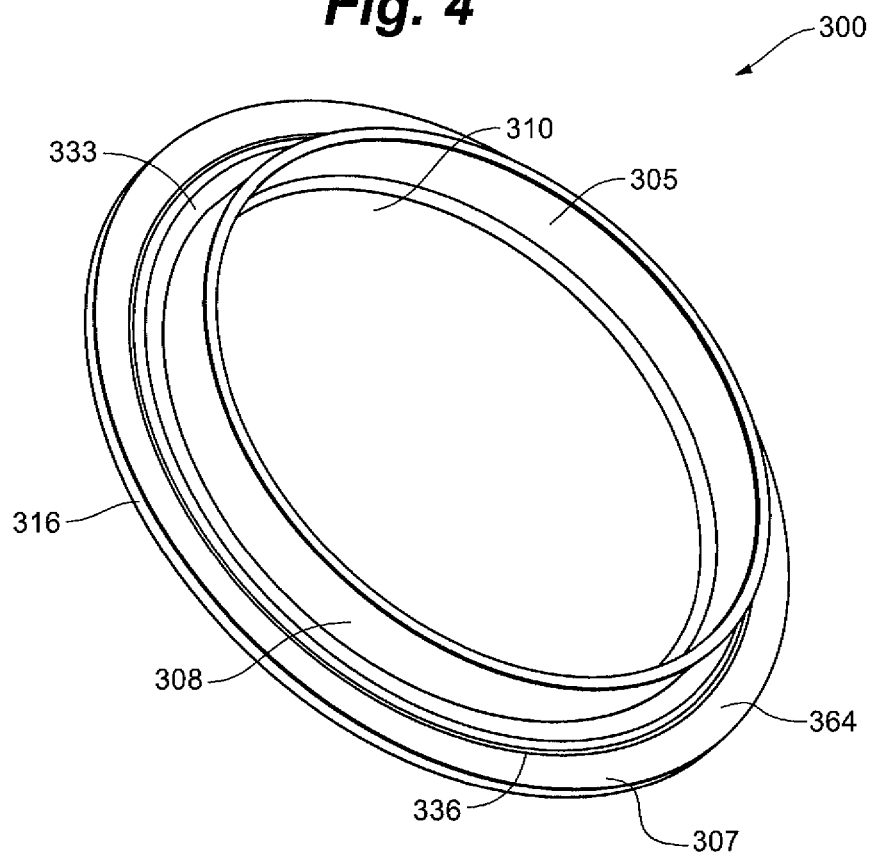
FIG. 4 illustrates an embodiment of a lid or cover of the enclosure of the invention.

FIG. 4 illustrates an embodiment of lid 300 of the invention that fits with base unit 200. As shown in the figure, lid 300 in this particular embodiment is disk shaped with a first lid or cover surface 310. An annular wall 305 with an external surface 308 and external diameter 311 (not shown) depends outwardly from first lid surface 310. Also disposed adjacent first lid surface 310 is an annular channel or cover flange portion 307 having a sealing surface portion 336 and a lid-bearing surface 314 with perimeter 316. Portion 336 extends between lid-bearing surface 314 and external surface 308 of annular wall 305 and forms a radial sealing surface which is adapted to seat a weatherproofing means in the form of an annular sealing o-ring 333 (not shown) which is slidingly received on external surface 308 of annular wall 305. External surface 308 of annular wall 305 is shaped and dimensioned to be press-fit within cavity 235 such that at least a portion of inner surface 230 of annular wall 225 is in frictional contact with at least a second portion of outer surface 308 of annular wall 305 and annular surface 336 is in sealing engagement with bearing surface 252 through the intermediation of annular sealing o-ring 333 interposed between the surfaces. O-ring 333 operates to prevent moisture and other contaminants from entering into an enclosure 360 defined by cavity 235 bounded by lid 300. The radial sealing surface ensures constant compression of o-ring 333 so that it forms a uniform seal all the way around thus avoiding moisture permeation at points of non-uniform sealing. In this embodiment, a substantial portion of base-unit flange surface 250 is also engaged with a substantial portion of lid-bearing surface 314 to comprise a connection or seal joint 254 (not shown) thereby limiting the magnitude of pressure loading that can be imposed on annular sealing o-ring 333.

Figure 5B:
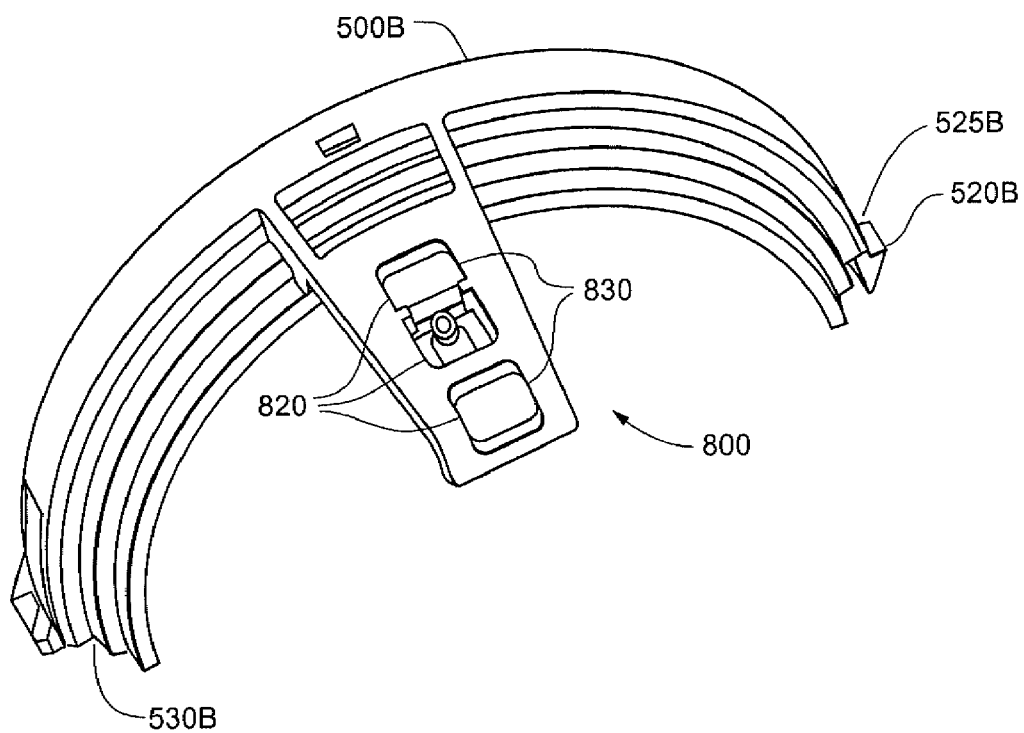

FIGS. 5A and 5B illustrate a pair of semicircular molded lock collars or channel sections 500A and 500B each having a u-shaped cross-section 510 that combine to form a flexible ring. Each lock collar has a first end formed into a barb 520A, and a barb 520B with at least one tapered surface 525A and 525B and a second end formed into a receptacle 530A and 530B, respectively, adapted to slidingly receive each barb 520A and 520B. Lock collars 500A and 500B are circumferentially positioned about seal joint 254 in a diametrically opposed relationship with each other (as shown in FIGS. 1 and 2) such that a substantial peripheral area of flange 248 and a substantial peripheral area of annular region 307 is disposed in captured relationship within u-shaped cross-section 510 of molded collars 500A and 500B. Barb 520A (520B) of lock collar 500A (500B) is inserted and snap-fitted into receptacle 530B (530A) of lock collar 520B (520A) so that lock collar 500A (500B) is releasably attached to lock collar 500B (500A) and opposing lock collars 500A and 500B form a continuous loop or band around the periphery of seal joint 254. Lock collars 500A, 500B are adapted in structure and dimension to cause surface 314 to be drawn up against surface 250 so that the two surfaces are sufficiently in a clamped and sealed engagement at seal-joint 254. This sealing and joining method resists the incursion of moisture from the ambient atmosphere into enclosure 290 through seal-joint 254.

Figure 6:
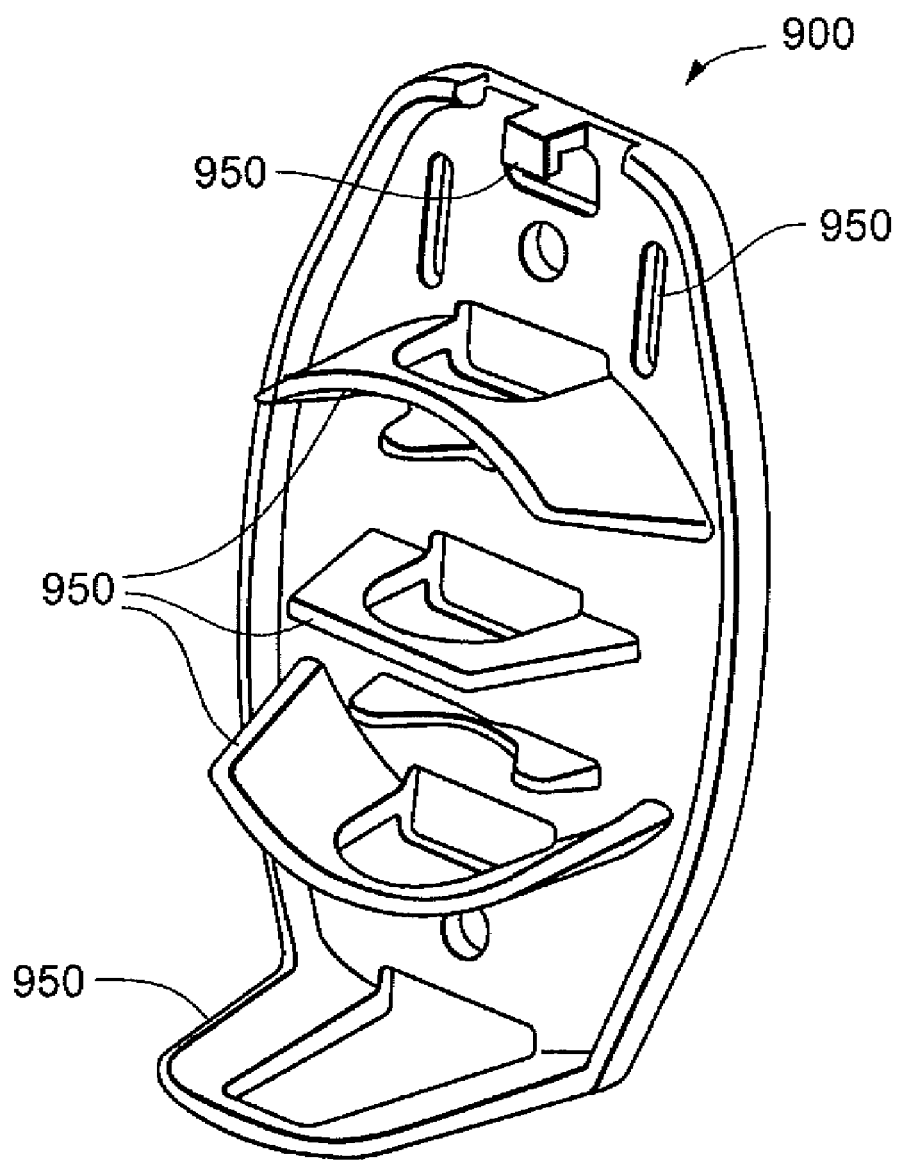
FIG. 6 illustrates the mounting bracket of the water endpoint enclosure of the invention.

FIGS. 1, 5B and 6 exemplify a mounting tab 800 and a universal mounting bracket 900 means through which the water endpoint enclosure, in this embodiment, is mounted to an external structure. At least one of lock collars 500A and 500B is provided with mounting tab 800 molded with a plurality of protrusions 820 and slots 830, the protrusions and slots adapted to releasably engage with a universal mounting bracket 900 at a plurality of locations 950. Each of said plurality of locations 950 are adapted to releasably secure a corresponding protrusion 820 or slot 830 on mounting tab 800 so that the water endpoint meter can be supported in a plurality of orientations from a plurality of structures to which mounting bracket 900 can be attached. The points of attachment of mounting bracket 900 may include but are not limited to a vertical wall via screw holes 952, a horizontal surface and a pole with a band/strap via holes 954. This provides a variety of mounting options for the water endpoint enclosure.

In operation, the electrical cables are threaded into enclosure 290 through conduit 264 and via cavity 274 enclosed by potting well 270. A viscous, insulative sealant 920 (not shown) is used to fill cavity 274 and at least a portion of conduit 264 to form a potted water barrier thereby substantially sealing enclosure 290 against moisture wicking up the cable. Typically a silicone or polyurethane based sealant, epoxies, a potting compound, greases, or any other waterproofing compound may be utilized to fill cavity 274. Lid 300 is press fit onto base unit 200, while collars 500A and 500B are adjusted around seal-joint interface 254 between base unit 200 and lid 300 so that at least a peripheral portion of both components are captured within the groove formed by the u-shaped cross-section of the collars. The barb at the end of a first collar is inserted and snap-fit into the receptacle of the second collar which disposes the collars in a continuous loop around the periphery of the base-unit and lid seal-joint. The circumferential extent of the collar is sized to cause a clamping action on the base-unit and lid when the collars are placed in the above-described configuration. The collars can be released and the base-unit and lid separated so that the electrical components and endpoint connections within the base-unit are accessible for repair or replacement.

In this embodiment, base unit 200 and lid 300 are unitary moldings formed of electrically nonconductive and moisture resistant materials such as polyurethane. Collars 500A and 500B are molded from an insulative and somewhat chemically inert material such as plastic. In a related embodiment, base unit and the lid can be cast from a metallic material, such as aluminum or stainless steel, so long as the base unit includes a bearing surface (such as surface 252) and the lid includes a corresponding wall (such as wall 305) and an o-ring interposed between the two fitting members.

While the particular water endpoint enclosure, shown and disclosed in detail above, is fully capable of obtaining the objects and providing the advantages stated, it is to be understood that it is merely illustrative of the presently preferred embodiments of the invention and various other modifications and changes with which the invention can be practiced and which are within the scope of the description provided herein will be readily apparent to those of ordinary skill in the art.

What is claimed is:

1. A water resistant enclosure adapted for use in metering applications comprising:
   an engageable base unit and cover,
   said base unit having an interior surface and a base unit sidewall extending laterally from said interior surface, said base unit sidewall having an exterior surface, a distal end portion, a base unit flange extending radially outward from said distal end portion, and an outer radial perimeter;
   said cover further including a cover surface and an annular wall extending upward from said cover surface, said annular wall adapted to fit slidingly within said distal end portion of said base unit sidewall, said cover further including a cover flange portion that extends radially outward from said annular wall such that said cover flange mirrors said outer radial perimeter of said base unit flange;
   a potting cavity integral to said interior surface of said base unit and bounded by at least two sides, a first side comprising a portion of said base unit sidewall, and at least another side comprising a contiguous barrier extending upward from said interior surface of said base unit, said barrier having two ends, each of said ends connected to said base unit sidewall;
   an aperture disposed through said portion of said base unit sidewall adjacent said potting cavity, said aperture allowing access to said potting cavity therethrough;
   a seal member bounded by said cover flange and said base unit flange; and
   a locking assembly having a ring dimensioned to pressingly mate with and capture both of said outer radial perimeters of said cover flange and said base unit flange;
   wherein a radial inset formed within said distal end portion has an outer perimeter bounded by said base unit sidewall and an upward facing lateral surface substantially parallel to said distal end portion;
   said seal member bounded by said annular wall, said cover flange and said inset when said base unit and said cover are engaged;
   wherein said ring comprises a plurality of channel sections, each having a barbed end and a receptacle end, said barbed end having at least one tapered surface and said receptacle end configured to slidingly receive said tapered surfaces of said barbed end and to securely capture said barbed end;
   said plurality of channel sections formed to capture said outer perimeters of said base unit flange and said cover flange and to compressibly engage said cover and said base unit when said plurality of channel sections are joined end to end.

2. The enclosure of claim 1 wherein a conduit portion is adapted to extend outward from said aperture.

3. The enclosure of claim 1 wherein a mounting tab extends from said ring, said mounting tab configured to releasably engage with an external bracket.

* * * * *

UNITED STATES PATENT AND TRADEMARK OFFICE
CERTIFICATE OF CORRECTION

PATENT NO. : 7,287,659 B2
APPLICATION NO. : 10/929749
DATED : October 30, 2007
INVENTOR(S) : Higgins Page 1 of 1

It is certified that error appears in the above-identified patent and that said Letters Patent is hereby corrected as shown below:

Column 1, line 57, please delete "teaches" and insert in its place --teach--.

Column 2, line 16, after "example," please insert --of the--.

Column 3, line 23, please delete "exemplaiy" and insert in its place --exemplary--.

Signed and Sealed this

Twenty-second Day of July, 2008

JON W. DUDAS
*Director of the United States Patent and Trademark Office*